United States Patent
Jung et al.

(10) Patent No.: US 7,812,523 B2
(45) Date of Patent: Oct. 12, 2010

(54) DISPLAY DEVICE HAVING AN AUXILIARY ELECTRODE FOR IMPROVED COMMON VOLTAGE AND FABRICATING METHOD THEREOF

(75) Inventors: Jae-hoon Jung, Seongnam-si (KR); Sung-soo Lee, Suwon-si (KR); Ji-hye Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 803 days.

(21) Appl. No.: 11/560,153

(22) Filed: Nov. 15, 2006

(65) Prior Publication Data

US 2007/0108899 A1    May 17, 2007

(30) Foreign Application Priority Data

Nov. 15, 2005   (KR) .................. 10-2005-0109142
Sep. 18, 2006   (KR) .................. 10-2006-0090046

(51) Int. Cl.
   *H01L 51/50*   (2006.01)
   *G09G 3/10*   (2006.01)

(52) U.S. Cl. ................................... 313/506; 315/169.3

(58) Field of Classification Search ................... None
   See application file for complete search history.

(56) References Cited

U.S. PATENT DOCUMENTS

| | | | | |
|---|---|---|---|---|
| 2002/0036463 A1* | 3/2002 | Yoneda et al. | ............... | 313/506 |
| 2003/0203551 A1* | 10/2003 | Cok et al. | ............... | 438/200 |
| 2005/0212413 A1 | 9/2005 | Matsuura et al. | | |
| 2006/0158095 A1* | 7/2006 | Imamura | ............... | 313/500 |

FOREIGN PATENT DOCUMENTS

| | | |
|---|---|---|
| CN | 1455629 | 11/2003 |
| CN | 1476282 | 2/2004 |
| CN | 1543269 | 11/2004 |
| JP | 2004-281399 A | 10/2004 |
| JP | 2005-235491 | 9/2005 |
| JP | 2005268062 | 9/2005 |

(Continued)

OTHER PUBLICATIONS

Enhanced performance of polymer light-emitting diodes using high-surface area polyaniline network electrodes Y. Yang, E. Westerweele, C. Zhang, P. Smith, and A. J. Heeger, J. Appl. Phys. 77, 694 (1995), DOI:10.1063/1.359056.*

(Continued)

*Primary Examiner*—Toan Ton
*Assistant Examiner*—Britt D Hanley
(74) *Attorney, Agent, or Firm*—Cantor Colburn LLP

(57) ABSTRACT

A display device includes a thin film transistor formed on a first insulating substrate, a first electrode electrically connected with the thin film transistor, an emission layer formed on the first electrode, a second electrode formed on the emission layer, an auxiliary electrode shaped like a mesh to at least partially expose the first electrode, the auxiliary electrode being electrically connected with the second electrode and receiving a common voltage therefrom, and a second insulating substrate placed on the auxiliary electrode. The exemplary embodiments of a display device, and a method of manufacturing the same, according to the present invention can apply a common voltage efficiently throughout the display and have an improved contrast ratio.

24 Claims, 14 Drawing Sheets

FOREIGN PATENT DOCUMENTS

| | | |
|---|---|---|
| JP | 2006201421 | 8/2006 |
| JP | 2006278241 | 10/2006 |
| JP | 2006318776 | 11/2006 |
| JP | 2006318910 | 11/2006 |
| KR | 1020030042641 | 6/2003 |
| KR | 1020030086164 | 11/2003 |
| KR | 1020050024033 | 10/2005 |
| KR | 1020060001712 | 1/2006 |
| WO | 0163975 | 8/2001 |
| WO | 2005041217 A1 | 6/2005 |

OTHER PUBLICATIONS

Machine translation of Unexamined Publication No. KR1020050024033 (Application No. 10-2003-0061834).*

Machine translation of Unexamined Publication No. KR1020030042641 (Application No. 1020010073376).*

* cited by examiner

DISPLAY DEVICE HAVING AN AUXILIARY ELECTRODE FOR IMPROVED COMMON VOLTAGE AND FABRICATING METHOD THEREOF

This application claims priority to Korean Patent Application No. 2005-0109142, filed on Nov. 15, 2005 and Korean Patent Application No. 2006-0090046, filed on Sep. 18, 2006 and all the benefits accruing therefrom under 35 U.S.C. §119, the contents of which in its entirety are herein incorporated by reference.

BACKGROUND OF THE INVENTION (a) Field of the Invention

The present invention relates to a display device and a fabricating method thereof, and more particularly, to a display device and a fabricating method thereof, which can efficiently apply a common voltage across the display and has an improved contrast ratio.

(b) Description of the Related Art

Among flat panel displays, an organic light emitting diode ("OLED") display has recently attracted attention because it is driven with a low voltage; is both thin and light; has a wide viewing angle; has a relatively short response time; and various other attractive and desirable features. OLED displays are classified as either passive matrix type or an active matrix type according to their respective driving methods.

In the active matrix OLED display, each pixel region is connected to an individual thin film transistor ("TFT") which controls emission of an organic emission layer in that pixel region. Each pixel region includes a pixel electrode, and each pixel electrode is electrically disconnected from adjacent pixel electrodes so that each pixel can be driven independently. A common electrode is formed on the organic emission layer.

Also, OLED displays are classified into bottom emission type and top emission type according to the direction that light is emitted from the organic emission layer.

In the top emission type OLED display, the light is emitted from the organic emission layer to the outside through the common electrode. Therefore, the top emission type OLED display prevents the loss of aperture ration associated with emitting light to the outside through the TFT. However, in the top emission type OLED display, the common electrode should be transparent. To make the common electrode transparent, the common electrode is formed by thinly depositing metal or by sputtering indium tin oxide ("ITO") or indium zinc oxide ("IZO"). However, the resistance of the thin common electrode is relatively high, so that it is difficult to apply a common voltage efficiently.

BRIEF SUMMARY OF THE INVENTION

Accordingly, it is an aspect of the present invention to provide a display device which can apply a common voltage efficiently and has an improved contrast ratio.

Another aspect of the present invention is to provide a fabricating method of a display device that can apply a common voltage efficiently and has an improved contrast ratio.

Additional aspects and/or advantages of the present invention will be set forth in part in the description which follows and, in part, will be obvious from the description, or may be learned by practice of the present invention.

The foregoing and/or other aspects of the present invention can be achieved by providing an exemplary embodiment of a display device including; a thin film transistor formed on a first insulating substrate, a first electrode electrically connected with the thin film transistor, an emission layer formed on the first electrode, a second electrode formed on the emission layer, an auxiliary electrode shaped like a mesh which at least partially exposes the first electrode, is electrically connected with the second electrode, and receives a common voltage, and a second insulating substrate placed on the auxiliary electrode.

According to another exemplary embodiment of the present invention, the display device further includes a black matrix formed between the auxiliary electrode and the second insulating substrate.

According to another exemplary embodiment of the present invention, the black matrix includes one of an organic material containing a black pigment, and chrome oxide.

According to another exemplary embodiment of the present invention, the display device further includes an organic layer formed on a portion of the first electrode exposed through the auxiliary electrode.

According to another exemplary embodiment of the present invention, the emission layer includes a plurality of layers which differ in the color of light emitted therefrom, and the organic layer is transparent.

According to another exemplary embodiment of the present invention, the emission layer emits white light, and the organic layer is a color filter including a plurality of layers which differ in color.

According to another exemplary embodiment of the present invention, the auxiliary electrode includes at least one selected from a group consisting of aluminum, silver, copper and gold.

According to another exemplary embodiment of the present invention, the second electrode has a light transmissivity of about 50% or more.

According to another aspect of the present invention, the display device further includes a conductive layer interposed between the second electrode and the auxiliary electrode.

According to another exemplary embodiment of the present invention, the conductive layer includes at least one selected from a group consisting of polypyrrole, polyaniline and polythiophene.

According to another exemplary embodiment of the present invention, the conductive layer includes conductive particles.

According to another aspect of the present invention, the conductive particle includes one of silver and nickel.

According to another exemplary embodiment of the present invention, light is emitted from the emission layer to an outside through the second insulating substrate.

According to another exemplary embodiment of the present invention, the first insulating substrate includes a display region and a non-display region formed along the circumference of the display region, and the non-display region is formed with a non-conductive sealant to join the first and second insulating substrates together.

According to another exemplary embodiment of the present invention, the display device further comprises a moisture absorption layer interposed between the black matrix and the auxiliary electrode.

According to another exemplary embodiment of the present invention, the moisture absorption layer comprises at least one selected from a group consisting of calcium(Ca), barium(Ba), calcium oxide(CaO) and barium oxide(BaO).

According to another exemplary embodiment of the present invention, the first insulating substrate includes a display region and a non-display region formed along the circumference of the display region, and the non-display region is formed with a shorting bar that applies the common voltage to the auxiliary electrode.

According to another exemplary embodiment of the present invention, the display device further includes a partition wall surrounding the emission layer.

According to another exemplary embodiment of the present invention, the first insulating substrate includes a display region and a non-display region formed in the circumference of the display region, and the auxiliary electrode and the partition wall face each other in the display region.

The foregoing and/or other aspects of the present invention are also achieved by providing an exemplary embodiment of a method of fabricating a display device, including; providing a first substrate by forming a thin film transistor on a first insulating substrate, a first electrode connected to the thin film transistor, an emission layer on the first electrode, and a second electrode on the emission layer, providing a second substrate by forming a black matrix shaped like a mesh on a second insulating substrate, an organic layer formed on the second insulating substrate not covered by the black matrix, and an auxiliary electrode on the black matrix, forming a sealant along the circumference of at least one of the first and second substrates, and joining the first substrate and the second substrate together to electrically connect the auxiliary electrode with the second electrode.

According to another exemplary embodiment of the present invention, the providing the second substrate includes forming a conductive layer on the auxiliary electrode.

The foregoing and/or other aspects of the present invention are also achieved by providing an exemplary embodiment of a method of fabricating a display device, including; forming a black matrix shaped like a mesh on an insulating substrate, forming an organic layer on the second insulating substrate not covered by the black matrix, and forming an auxiliary electrode on the black matrix.

BRIEF DESCRIPTION OF THE DRAWINGS

The above and/or other aspects and advantages of the present invention will become apparent and more readily appreciated from the following description of the embodiments, taken in conjunction with the accompanying drawings of which.

DETAILED DESCRIPTION OF THE INVENTION

Figure 1:
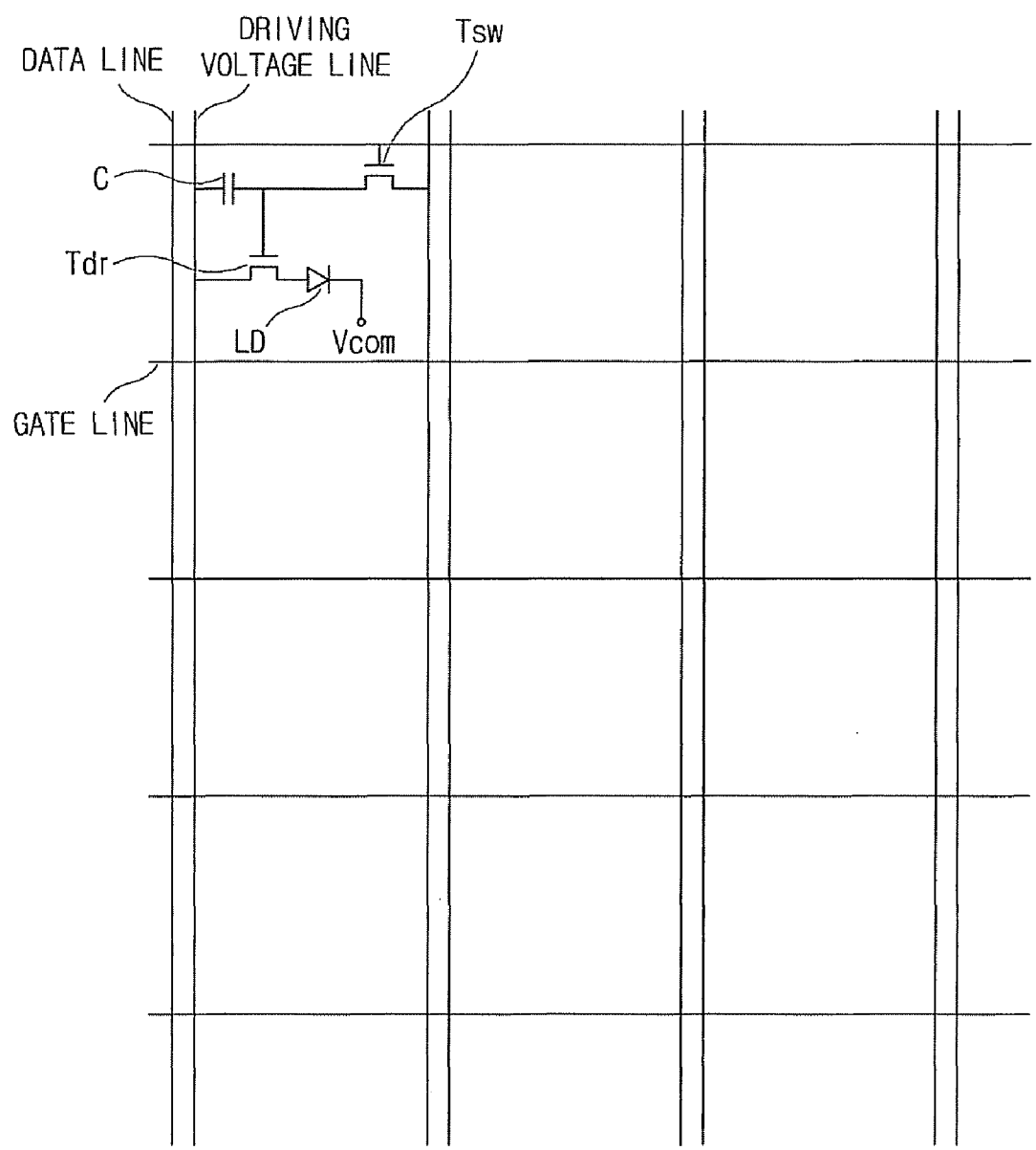
FIG. 1 is an equivalent circuit diagram of a first exemplary embodiment of a display device according to the present invention.

Hereinafter, embodiments of the present invention will be described with reference to accompanying drawings, wherein like numerals refer to like elements and repetitive descriptions will be avoided as necessary.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-section illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is an equivalent circuit diagram of a first exemplary embodiment of a display device according to the present invention.

Referring to FIG. 1, a display device 1 according to the first embodiment includes a plurality of signal lines.

The signal lines include a gate line to transmit a scan signal, a data line to transmit a data signal, and a driving voltage line to apply a driving voltage. The data line and the driving voltage line are adjacent to and arranged in parallel with each other. Further, the gate line intersects both the data line and the driving voltage line.

A pixel includes an organic light emitting device LD, a switching transistor Tsw, a driving transistor Tdr, and a capacitor C.

The driving transistor Tdr has a control terminal connected to the switching transistor Tsw, an input terminal connected to the driving voltage line, and an output terminal connected to the organic light emitting device LD.

The organic light emitting device LD has an anode connected to the output terminal of the driving transistor Tdr, and a cathode connected to a common voltage Vcom. The organic light emitting device LD emits light with brightness varying according to the intensity of a current outputted from the driving transistor Tdr. A plurality of light emitting devices may work in conjunction to display an image. Here, the intensity of the current outputted from the driving transistor Tdr varies according to voltages applied between the control terminal and the output terminal of the driving transistor Tdr.

The switching transistor Tsw has a control terminal connected to the gate line, an input terminal connected to the data line, and an output terminal connected to the control terminal of the driving transistor Tdr and one side of the capacitor C. The switching transistor Tsw transmits the data signal from the data line to the driving transistor Tdr in response to the scan signal applied to the gate line.

The capacitor C is connected on one end to the control terminal of the driving transistor Tdr and the other end is connected through the driving voltage line to the input terminal of the driving transistor Tdr. The capacitor C stores and maintains the data signal to be inputted to the control terminal of the driving transistor Tdr.

Figure 2:
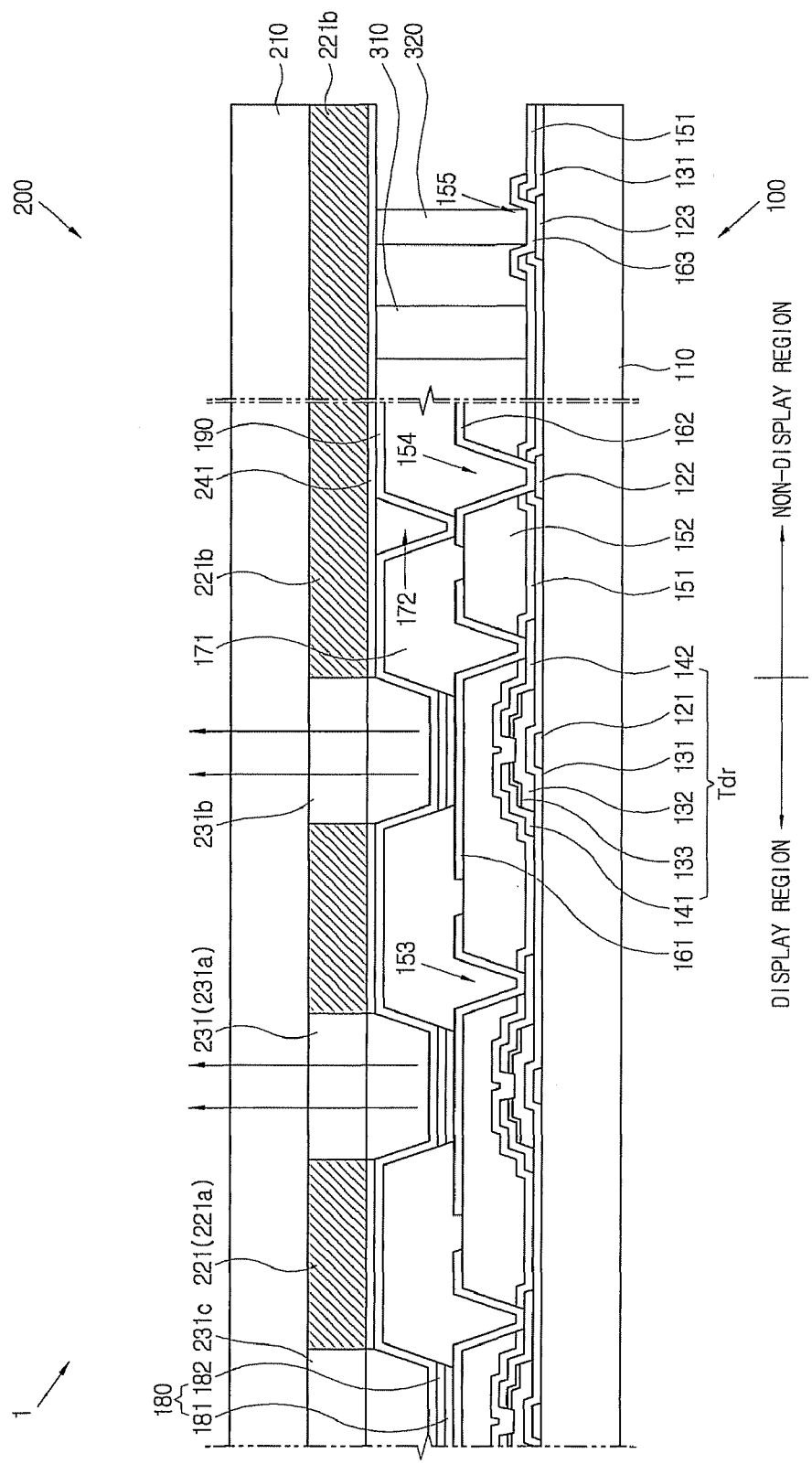
FIG. 2 is a cross-sectional view of the first exemplary embodiment of a display device according to the present invention.
Figure 3:
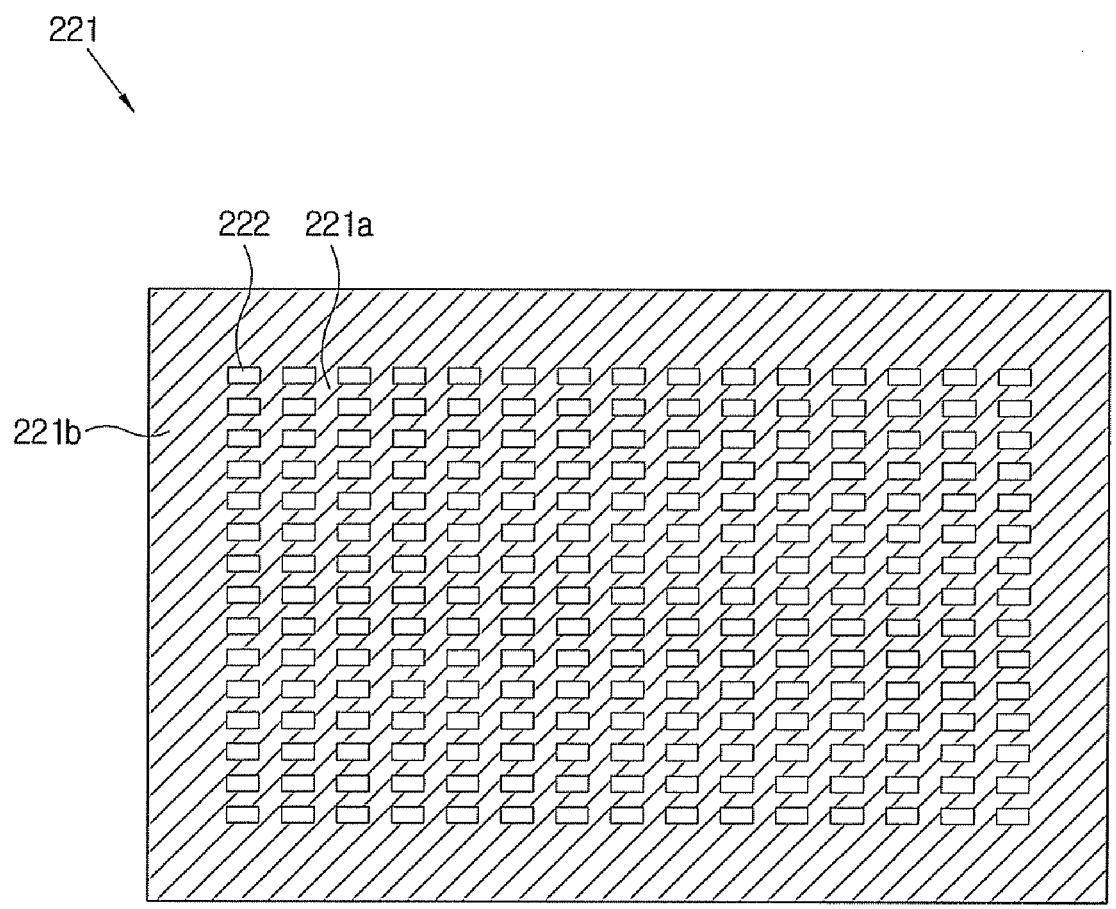
FIG. 3 is a plan view showing an exemplary embodiment of a black matrix in the first exemplary embodiment of a display device according to the present invention.

Below, the display device according to the first embodiment will be described in more detail with reference to FIGS. 2 and 3. FIG. 2 is a cross-sectional view of the display device according to a first exemplary embodiment of the present invention, and FIG. 3 is a plan view showing an exemplary embodiment of a black matrix in the first exemplary embodiment of a display device according to the first embodiment of the present invention. In FIG. 2, only the driving transistor Tdr is illustrated.

The first exemplary embodiment of a display device 1 according to the present invention includes a first substrate 100, a second substrate 200, and a sealant 310 joining the two substrates 100 and 200 together.

The first substrate 100 is formed with the driving transistor Tdr, the pixel electrode 161, the emission layer 180, and the common electrode 190. The second substrate 200 is formed with a black matrix 221, a color filter 231, and an auxiliary electrode 241.

The first substrate 100 has a gate electrode 121, a first common voltage applying part 122 and a second common voltage applying part 123 formed on a first insulating substrate 110 made of an insulating material such as glass, quartz, plastic or a similar substance. The first and second common voltage applying parts 122 and 123 receive a common voltage from the outside and supply the common voltage to the common electrode 190 and the auxiliary electrode 241, respectively. The gate electrode 121, the first common voltage applying part 122 and the second common voltage applying part 123 are formed on the same layer, and the first and second common voltage applying parts 122 and 123 are provided on a non-display region.

A gate insulating film 131 including silicon nitride ("$SiN_x$") or the like is formed on the first insulating substrate 110 and the gate electrode 121. The gate insulating film 131 is partially removed on the first and second common voltage applying parts 122 and 123.

A semiconductor layer 132 including amorphous silicon and an ohmic contact layer 133 including n+ hydrogenated amorphous silicon highly doped with an n-type dopant are formed in sequence on the gate insulating film 131 corresponding to the gate electrode 121. Here, the ohmic contact layer 133 is separated into two parts with respect to the gate electrode 121.

A source electrode 141 and a drain electrode 142 are formed on the ohmic contact layer 133 and the gate insulating layer 131. Additionally, the source electrode 141 and the drain electrode 142 are separated with respect to the gate electrode 121.

A passivation film 151 is formed on the source electrode 141, the drain electrode 142, the exposed part of the ohmic contact layer 133 and an upper part of the semiconductor layer 132 exposed between the source and drain electrodes 141 and 142. The passivation film 151 may include silicon nitride ("$SiN_x$") or other similar substances. The passivation film 151 is partially removed on the drain electrode 142 and the first and second common voltage applying parts 122 and 123.

An organic film 152 is formed on the passivation film 151. The organic film 152 includes one of benzocyclobutene ("BCB") series, olefin series, acrylic resin series, polyimide series, and fluoropolymer such as polytetrafluoroethylene (PTFE), perfluorocyclobutane (PFCB), fluorinated ethylene propylene(FEP), poly fluoro alkoxy(PFA), ethylene tetra fluoro ethylene(ETFE) and polyvinylidene fluoride(PVDF). The fluoropoymer may have structural formula 1 which is known as cytop(trademark) produced by Asahi Glass, Japan. The organic film 152 is partially removed on the drain electrode 142 and the first and second common voltage applying parts 122 and 123.

Structural Formula 1:

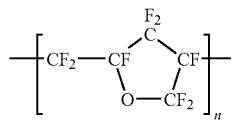

A pixel electrode 161 is formed on the top of the organic film 152. The pixel electrode 161, also called an anode, supplies holes to an emission layer 180. The pixel electrode 161 includes a transparent conductive material such as indium tin oxide ("ITO"), indium zinc oxide ("IZO"), or other similar materials, and is connected to the drain electrode 142 through a contact hole 153.

First and second contact members 162 and 163 are formed on the first and second common voltage applying parts 122 and 123, respectively. The first and second contact members 162 and 163 are formed on the same layer as the pixel electrode 161. The first contact member 162 is connected to the first common voltage applying part 122 through a contact hole 154, and the second contact member 163 is connected to the second common voltage applying part 123 through a contact hole 155.

A partition wall 171 is formed on the pixel electrode 161 and the organic film 152 and surrounds the pixel electrode 161. The partition wall 171 divides the pixel electrodes 161 and defines a pixel region. Further, the partition wall 171 prevents the source and drain electrodes 141 and 142 of the thin film transistor Tdr from being short-circuited with the common electrode 190 by providing a physical separation between them. The partition wall 171 includes a photosensitive material such as an acrylic resin, a polyimide resin, or other similar substance, which has resistance to both heat and solvents; or alternatively it may include an inorganic material such as $SiO_2$, and $TiO_2$. An alternative embodiment of the partition wall 171 may have a double-layered structure including an organic layer and an inorganic layer. Also, the partition wall 171 is formed with a contact hole 172 through which the first contact member 162 is exposed.

An emission layer 180 is formed on the portion of the pixel electrode 161 which is not covered by the partition wall 171. The emission layer 180 includes a hole injecting layer 181, and an organic emission layer 182.

The hole injecting layer 181 includes a hole injecting material such as poly(3,4-ethylenedioxy thiophene)("PEDOT") and polystyrene sulfonic acid ("PSS"). The hole injecting materials are dropped by an inkjet method in an aquatic suspension state, thereby forming the hole injecting layer 181.

The organic emission layer 182 is also formed by the inkjet method and, according to this first exemplary embodiment, emits white light.

A hole from the pixel electrode 161 and an electron from the common electrode 190 are combined into an exciton in the organic emission layer 182, and light is emitted in the exciton formation process.

The common electrode 190 is provided on the partition wall 171 and the emission layer 182. The common electrode 190, also called a cathode, supplies the electron to the organic emission layer 182. The common electrode 190 may include an alloy of magnesium and silver or alternatively an alloy of calcium and silver. The common electrode can have a thickness of about 50 nm to about 200 nm. When the thickness of the common electrode 190 is less than about 50 nm, resistance increases excessively, so that a common voltage is not efficiently applied across the entire display. On the other hand, when the thickness of the common electrode 190 is more than about 200 nm, the common electrode 190 may become opaque. Preferably, the common electrode 190 has a light transmissivity of 50% or more.

The common electrode 190 is connected with the first contact member 162 through the contact hole 172. The first contact member 162 is connected with the first common voltage applying part 122, so that the common electrode 190 receives the common voltage. However, the first common voltage applying part 122 is placed in the outer circumference of the display region, so that a voltage drop arises in the common electrode 190 relatively distant from the first common voltage applying part 122. In the case of the top-emission type display in which the light from the organic emission layer 182 passes through the common electrode 190, as in this first exemplary embodiment, the thickness of the common electrode 190 is limited to prevent the brightness of the light passing through from decreasing. However, the limited thickness causes the resistance of the common electrode 190 to increase and the voltage drop of the common electrode 190 relatively distant from the voltage applying part 122 to become intensified.

In an alternative exemplary embodiment the common electrode 190 may have a double-layered structure. For example, the double layered structure may include a lower layer of metal alloy, and an upper layer of ITO or IZO. Here, the upper ITO or IZO layer should be formed by a low temperature deposition in order to protect the lower emission layer 180 from heat or plasma. However, the ITO or IZO formed by the low temperature deposition method may have bad film quality and bad specific resistance, so that it cannot solve the voltage drop problem described above.

The foregoing voltage drop problem can be solved by the exemplary embodiment of an auxiliary electrode 241 of the second substrate 200 according to the present invention. The second substrate 200 may be described as follows.

Referring to FIGS. 2 and 3, a black matrix 221 is formed on the second insulating substrate 210. The black matrix 221 is shaped like a mesh as shown in FIG. 3. An opening 222, in which the black matrix 221 is not formed, corresponds to the emission layer 180 of the first substrate 1000. The black matrix 221 includes an inside black matrix 221*a* formed on the display region and having a relatively narrow width, and an outside black matrix 221*b* formed in the non-display region along the edge of the second insulating substrate 210 and having a relatively wide width. The black matrix 221 includes a photosensitive organic material containing a black pigment or chrome oxide. Here, carbon black or titanium oxide may be used as the black pigment.

According to this first exemplary embodiment, a color filter 231 is provided in the opening 222 of the black matrix 221. The color filter 231 includes one of three sub-layers 231*a*, 231*b* and 231*c*, each differing in color from one another and having a predetermined pattern. Thus, the white light emitted from the emission layer 180 is colored while passing through the color filter 231.

The auxiliary electrode 241 is formed on the black matrix 221 and shaped like a mesh. However, the auxiliary electrode 241 is not formed on the color filter 231. Here, the auxiliary electrode 241 includes metal having a relatively low resistance, e.g., aluminum (Al), silver (Ag), copper (Cu), gold (Au), or other materials with similar properties.

The auxiliary electrode 241 is connected with the second contact member 163 that covers the second common voltage applying part 123, through a shorting bar 320, thereby receiving the common voltage. The auxiliary electrode 241 is in direct contact and electrically connected with the common electrode 190. The auxiliary electrode 241 supplies the common voltage to the common electrode 190 so that the common electrode 190 can efficiently supply the common voltage to the emission layer 180.

The first substrate 100 and the second substrate 200 are joined together by the sealant 310 formed in the non-display region. The sealant 310 is non-conductive, and may include an acrylic resin and/or an epoxy resin.

In addition, a moisture absorber (not shown) may be provided in the second substrate 200 so as to protect the emission layer 180 from moisture. The moisture absorber may be placed in the non-display region.

Below, a method of fabricating the display device according to the first embodiment of the present invention will be described with reference to FIGS. 4A through 4H. FIGS. 4A through 4D show the fabricating method of the first substrate 100, and FIGS. 4F through 4H show the fabricating method of the second substrate 200.

The method of fabricating the first substrate 100 will be described below with reference to FIGS. 4A through 4D.

Figure 4A:
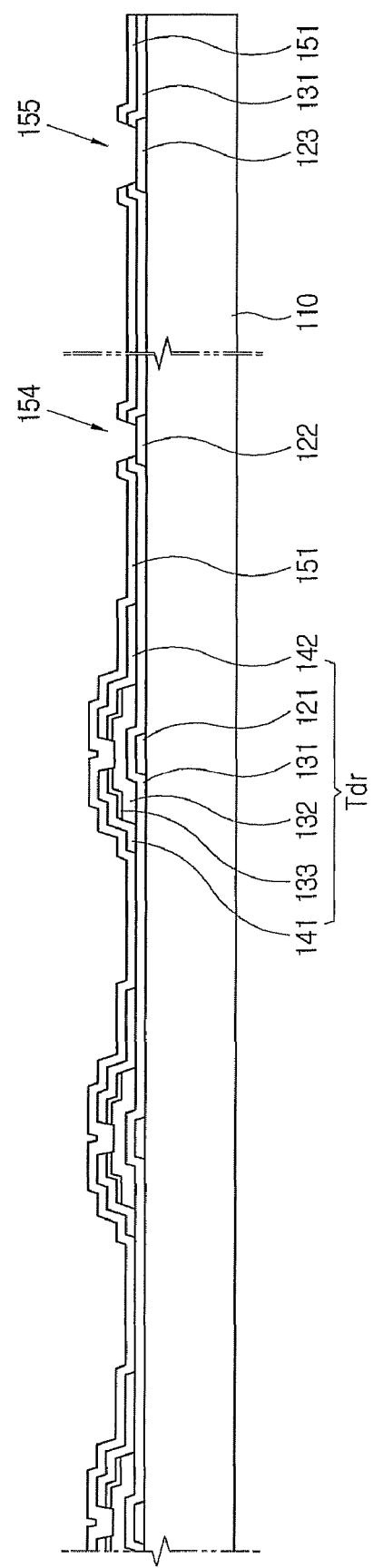
FIGS. 4A through 4H are cross-sectional views showing an exemplary embodiment of a method of fabricating the first exemplary embodiment of a display device according to the present invention.

First, as shown in FIG. 4A, the thin film transistor Tdr is formed on the first insulating substrate 110. The thin film transistor Tdr has a channel including amorphous silicon and may be formed by a well-known method. While forming the thin film transistor Tdr, the first and second common voltage applying parts 122 and 123 are also formed. After forming the thin film transistor Tdr, the passivation film 151 is formed on the thin film transistor Tdr. In the case where the passivation film 151 includes silicon nitride, a chemical vapor deposition method may be used to form the passivation film 151. Additionally, the first and second common voltage applying parts 122 and 123 are exposed though the contact holes 154 and 155.

Figure 4B:
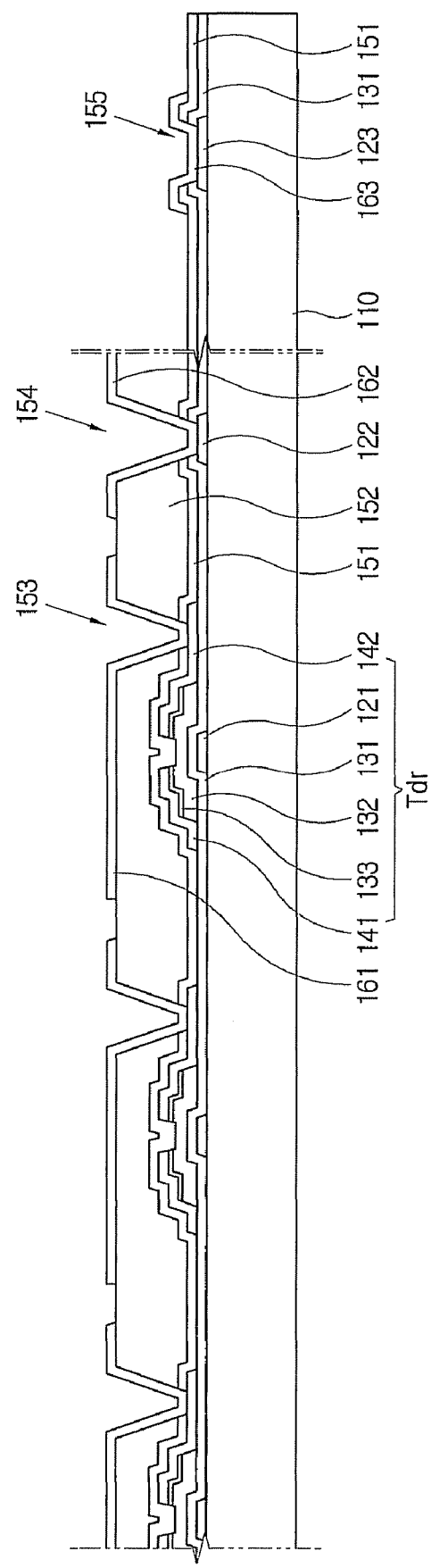

Then, as shown in FIG. 4B, the organic film 152, the pixel electrode 161, the first contact member 162 and the second contact member 163 are formed. Here, the organic film 152 is formed by a slit coating method or a spin coating method, and formed with the contact holes 153 and 154 by exposure and development. The pixel electrode 161, the first contact member 162, and the second contact member 163 may be formed by photolithographing a transparent conductive layer formed by a sputtering method. Meanwhile, in the case of the top-emission type display, it is not necessary to make the pixel electrode 161 transparent. In this case, the pixel electrode 161 may be made of a reflective metal.

Figure 4C:
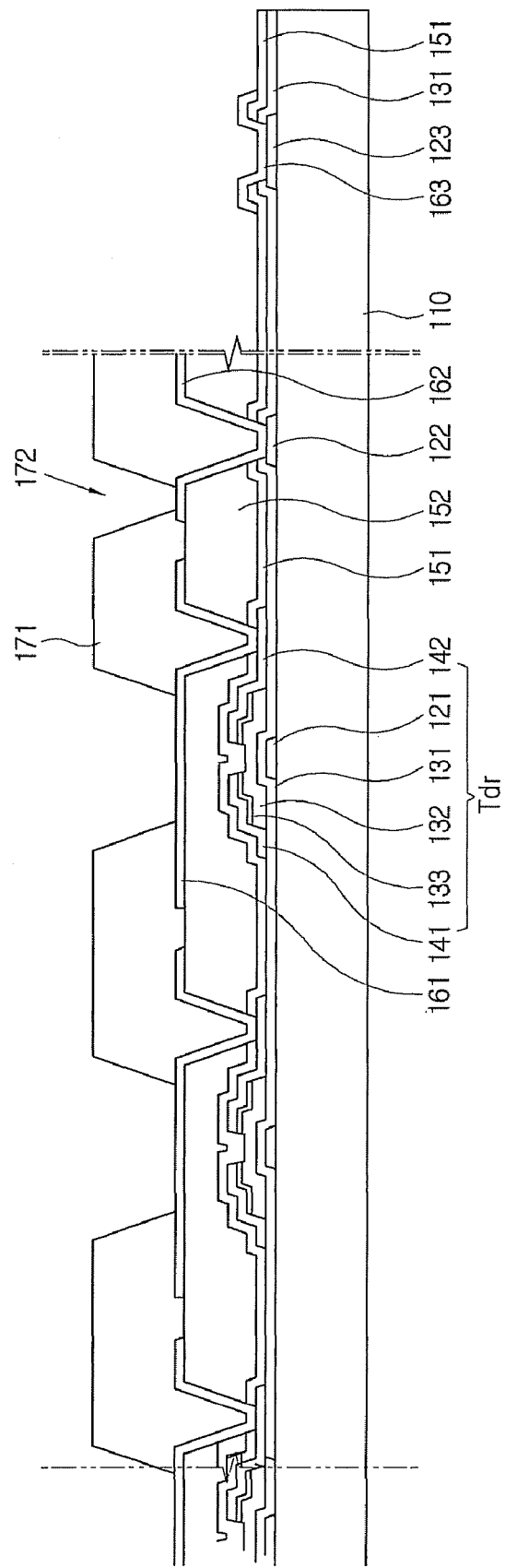

Next, the partition wall 171 is formed as shown in FIG. 4C. Here, the partition wall 171 is formed by exposing and developing a photosensitive material layer.

Figure 4D:
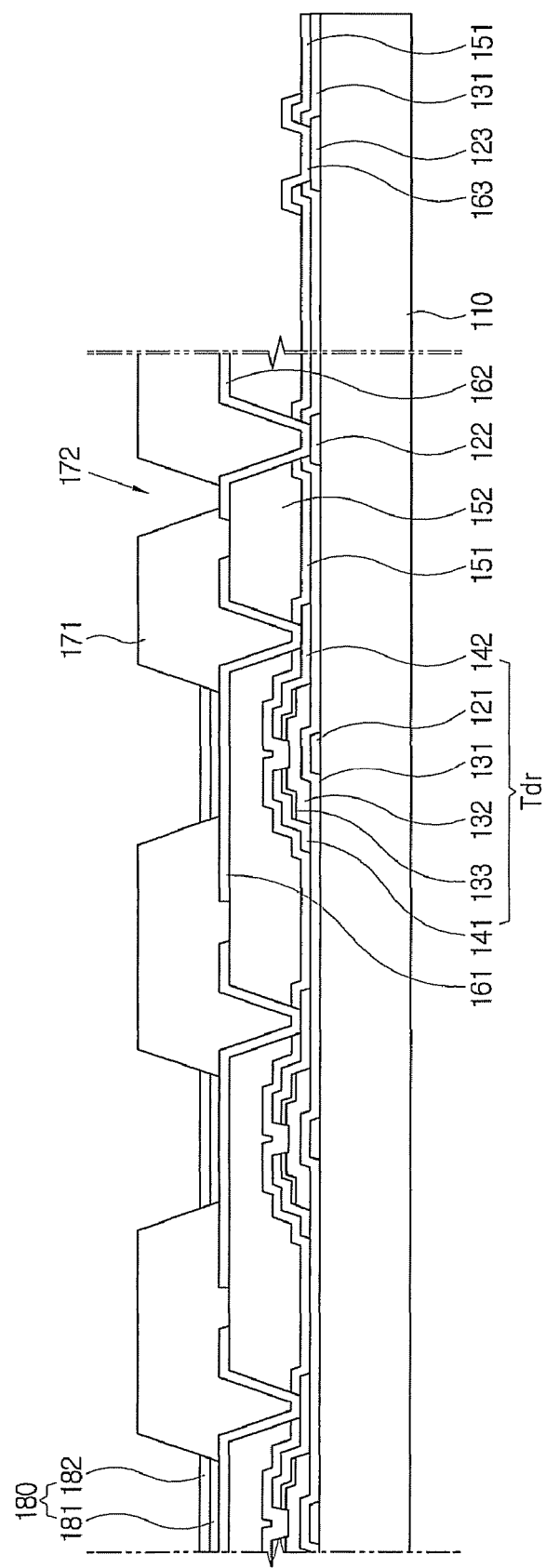

Then, the emission layer 180 is formed as shown in FIG. 4D. The hole injecting layer 181 is formed by dropping a hole injecting solution, including the hole injecting material as a solute, through the inkjet method and then evaporating out the solvent. The hole injecting material may include a poly thiophene derivative such as poly(3,4-ethylenedioxy thiophene) ("PEDOT"); a mixture such as polystyrene sulfonic acid ("PSS"); and a polarity solvent dissolving the mixture. As an example of the polarity solvent, there is isopropyl alcohol ("IPA"); n-butanol; ɤ-butylolactone; N-methyl pyrrolidone; 1,3-dimethyl-2-imidazolidinon ("DMI") and its derivatives; glycol ether such as carbitol acetate, butyl carbitol acetate, and other substances with similar characteristics. The organic emission layer 182 may be formed by dropping an emission solution, containing a white-light emitting material as a solute, through the inkjet method and evaporating out the solvent.

Figure 4E:
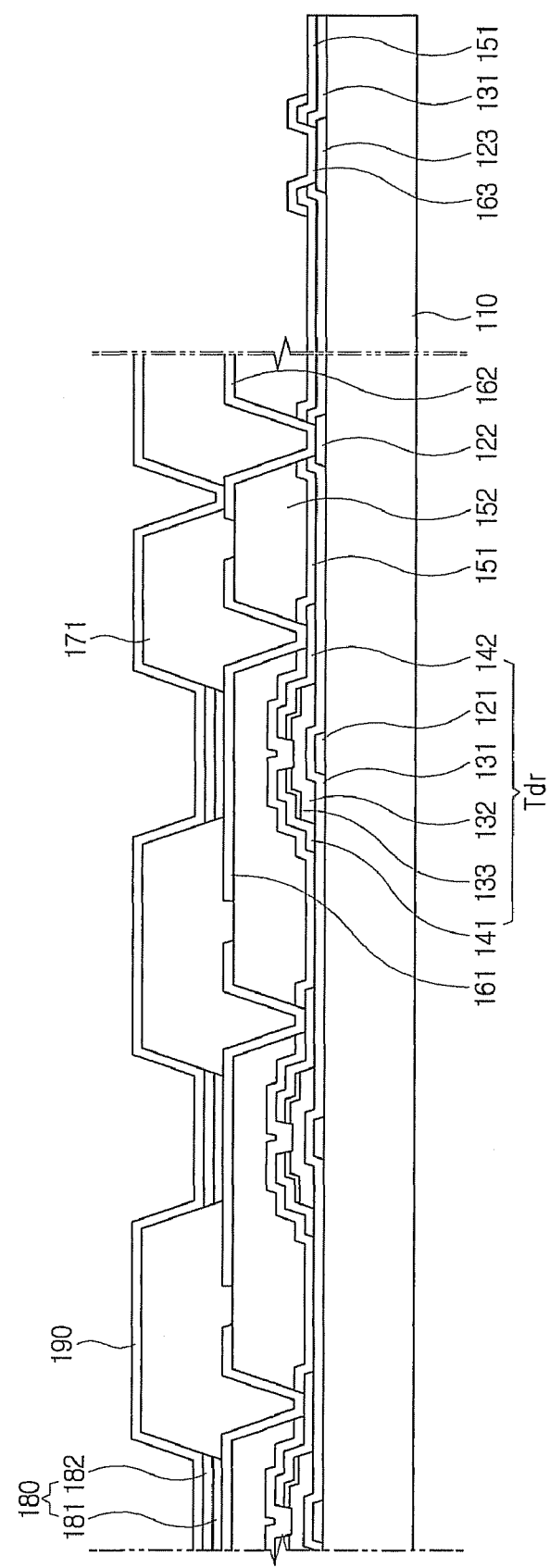
Figure 4F:
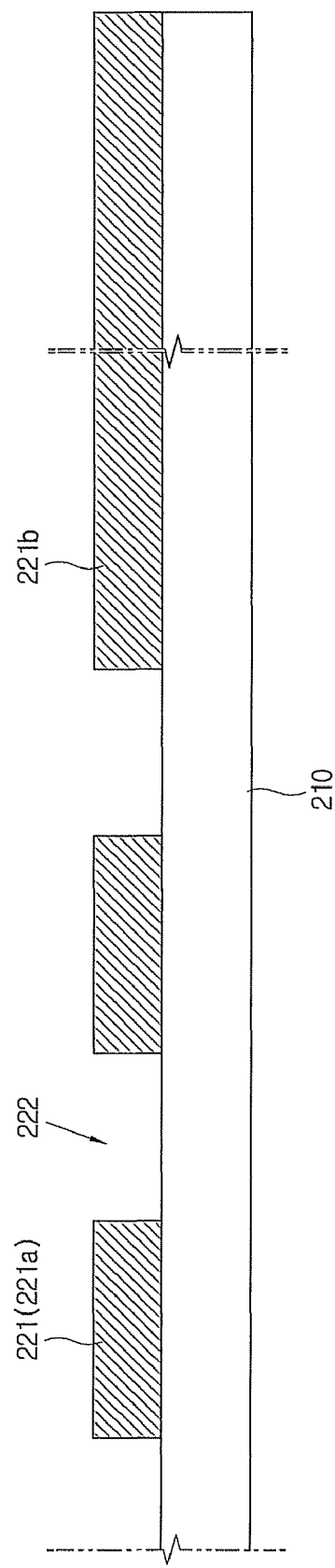
Figure 4G:
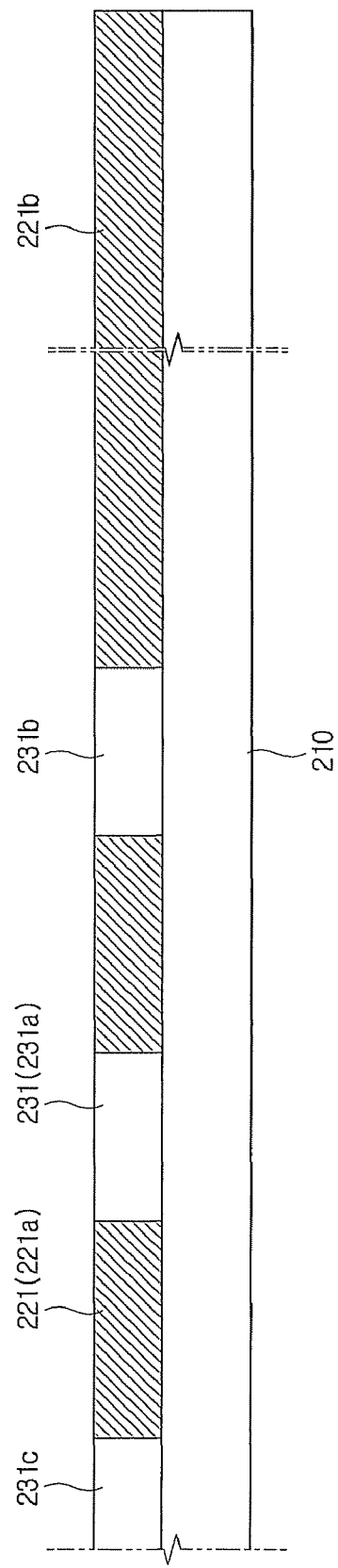
Figure 4H:
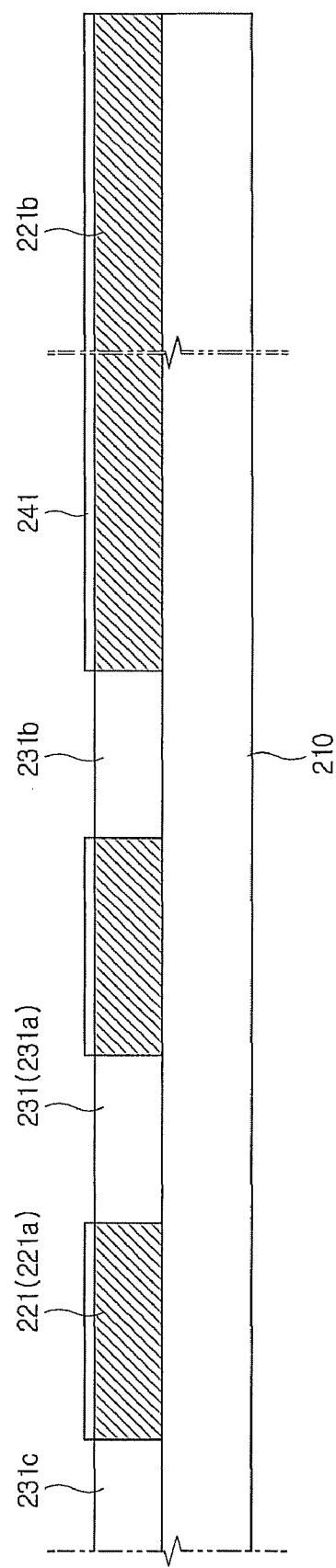

Then, as shown in FIG. 4E, the common electrode 190 is formed on the partition wall 171 and the organic emission layer 182, thereby completing the first substrate 1000.

The method of fabricating the second substrate 200 will be described below with reference to FIGS. 4F through 4H.

First, as shown in FIG. 4F, the black matrix 221 is formed on the second insulating substrate 210. In the case where the black matrix 221 includes chrome oxide, it may be formed by sputtering and photolithography. Alternatively, when the black matrix 221 includes an organic material containing the black pigment, it may be formed by coating, exposure, and development. In either case, the black matrix 221 includes the inside black matrix 221a and the outside black matrix 221b, and the opening 222 is formed between the inside black matrix 221a.

Then, as shown in FIG. 4G, the color filter 231 is formed in the opening 222 of the black matrix 221. The color filter 231 may include one of three sub-layers 231a, 231b and 231c, which are formed by coating, exposure and development.

Then, as shown in FIG. 4H, the auxiliary electrode 241 is formed on the black matrix 221, thereby completing the second substrate 200. Here, the auxiliary electrode 241 may be formed by depositing the metal layer through the sputtering method and photolithographing the deposited metal layer.

The shorting bar 320 can be formed in either of the two substrates 100 and 200 before joining them together.

After the first and second substrates 100 and 200 are completed, and the shorting bar has been formed on either one of them, the sealant 310 is formed along either edge of the first or second substrate 100 or 200, and the two substrates 100 and 200 are joined together. When the sealant 210 is hardened, the display device 1 according to the first embodiment of the present invention is completed. As the two substrates 100 and 200 are joined together, the auxiliary electrode 241 is in direct contact with the common electrode 190, thereby receiving the common voltage from the second common voltage applying part 123.

According to the first embodiment of the present invention, the common voltage is efficiently applied to the common electrode 190, throughout the entire display, by the auxiliary electrode 241. Further, the black matrix 221 may be used to increase a contrast ratio of the display.

Figure 5:
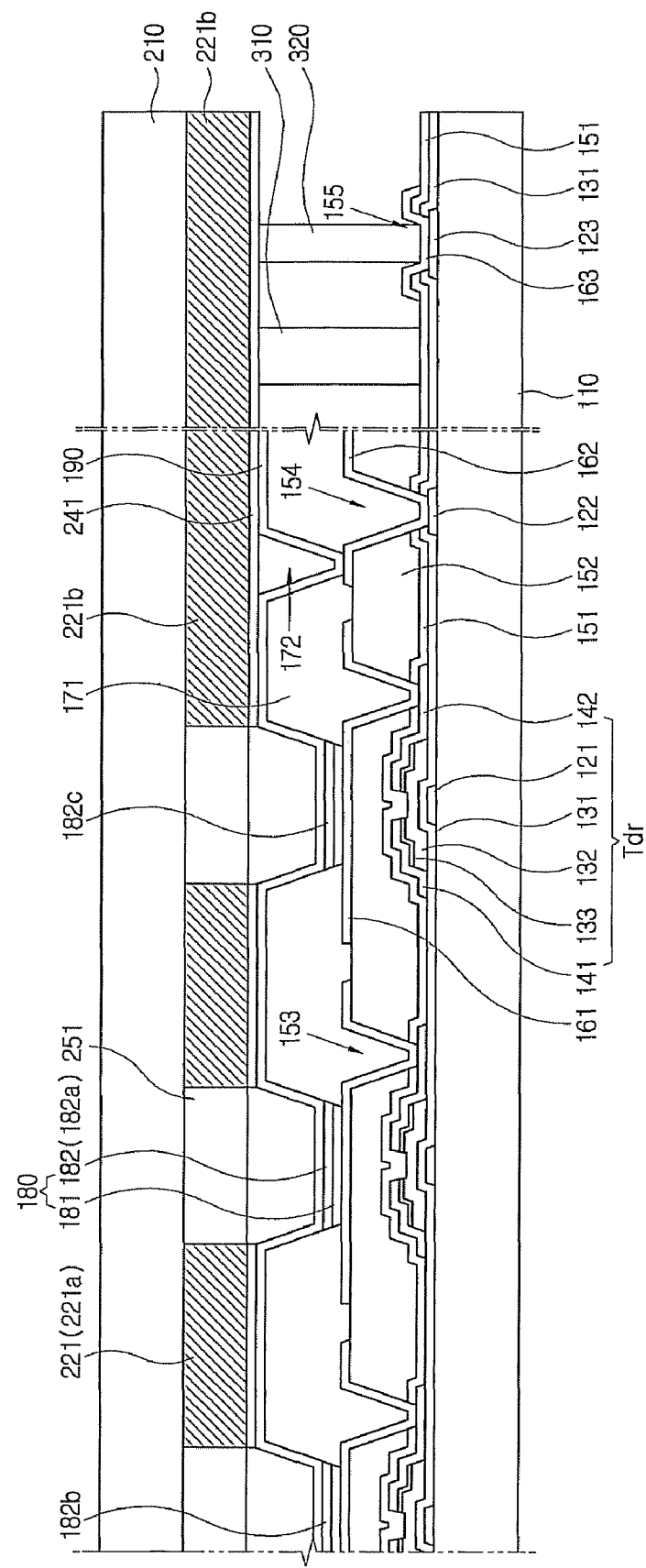
FIGS. 5 through 7 are cross-sectional views of second through fourth exemplary embodiments of display devices according to the present invention, respectively.
Figure 6:
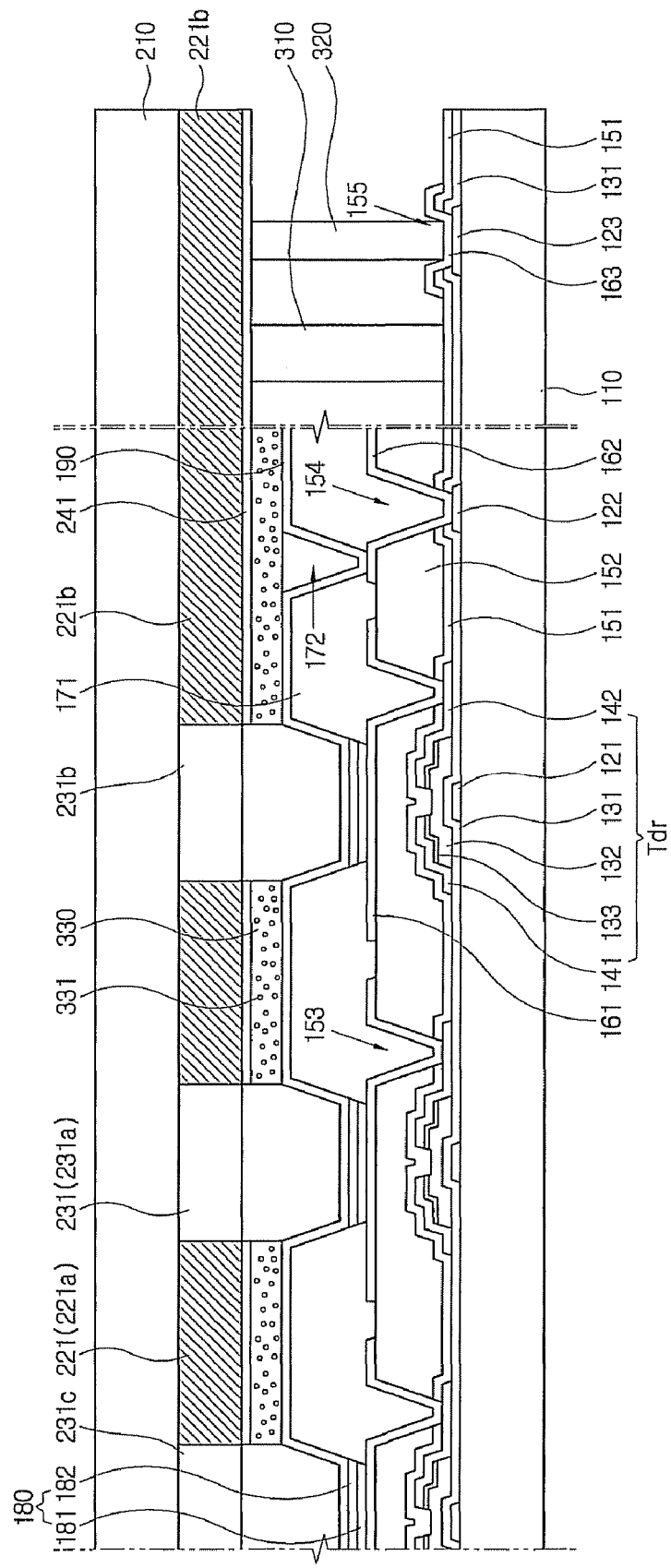
Figure 7:
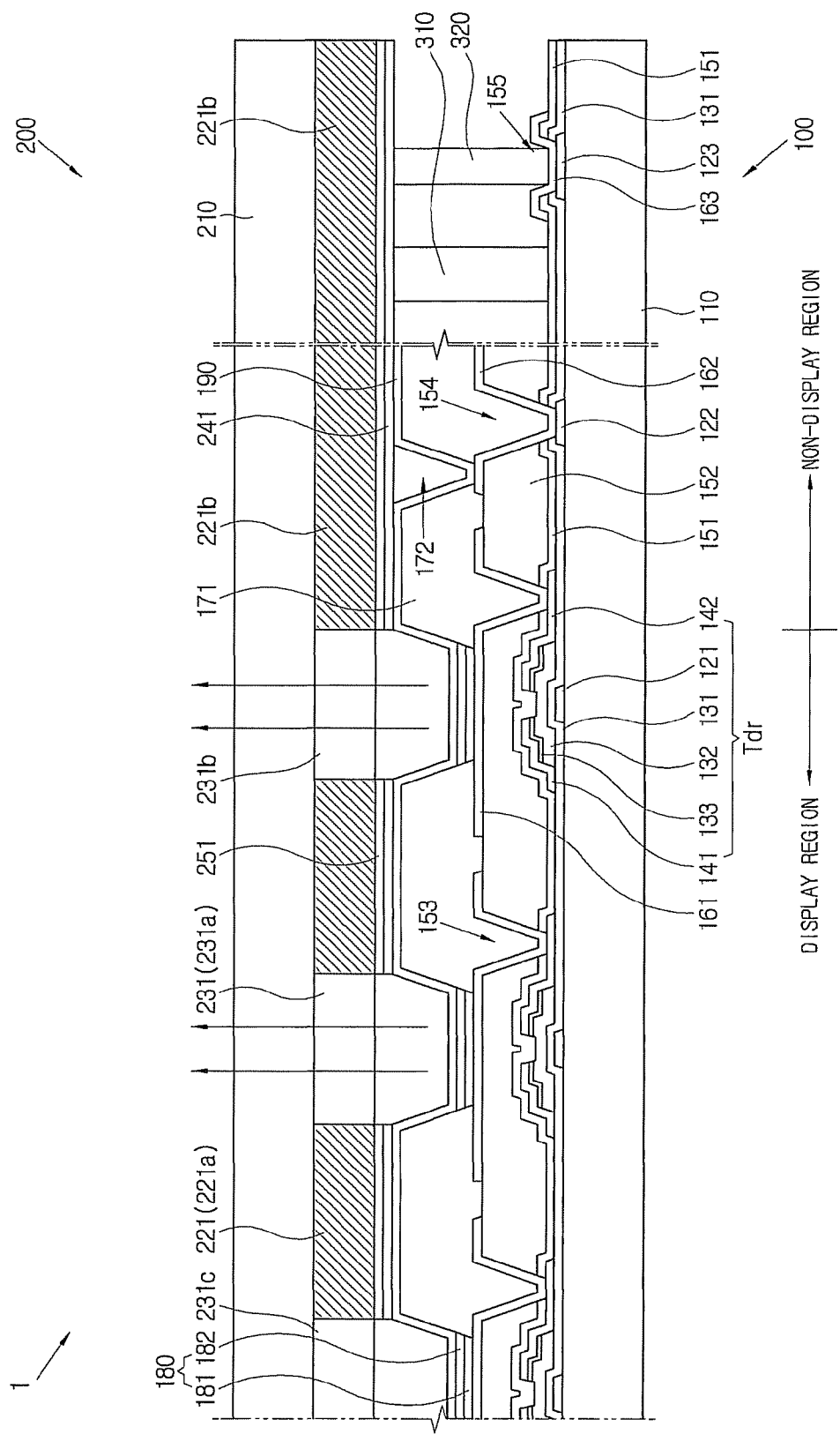

FIGS. 5 through 7 are sectional views of display devices according to second through fourth embodiments of the present invention, respectively.

Referring to FIG. 5, an organic emission layer 182 according to the second embodiment may include one of three sub-layers 182a, 182b and 182c, which differ in the color of light emitted therefrom; e.g., they may emit red, blue and green light, respectively. The organic emission layer 182 may include a poly fluorene derivative; a (poly)paraphenylenevinylene derivative; a polyphenylene derivative; polyvinylcarbazole; and poly thiophene. The polymer materials listed above may be doped with a perylene pigment; a rothermine pigment; rubrene; perylene; 9,10-diphenylanthracene; tetraphenylbutadiene; Nile red; coumarine 6; Quinacridone, or other substances with similar characteristics. Meanwhile, the transparent organic layer 251 is formed on the organic emission layer 182. The organic layer 251 is colorless and includes one of benzocyclobutene ("BCB") series, olefin series, acrylic resin series, polyimide series, and fluoropolymer.

Referring to FIG. 6, according to the third embodiment of the present invention, a conductive layer 330 is formed between the common electrode 190 and the auxiliary electrode 241. The conductive layer 330 includes a conductive polymer and enhances the electric connection between the common electrode 190 and the auxiliary electrode 241. As an example of the conductive polymer, there are poly pyrrole, poly aniline, poly thiophene, and other substances with similar characteristics. The conductive layer 330 also includes conductive particles 331. Here, the conductive particles 331 comprise nickel or silver.

The conductive layer 330 can either be formed on the first substrate 100 or the second substrate 200 while being fabricated.

Referring to FIG. 7, according to the fourth embodiment of the present invention, a moisture absorption layer is formed between the black matrix 221 and the auxiliary electrode 241. The moisture absorption layer 251 prevents the emission layer 180 being deteriorated by moisture. The moisture absorption layer 251 may comprise calcium(Ca), barium (Ba), calcium oxide(CaO) or barium oxide(BaO).

In the above-described exemplary embodiments, a polymer material is used for the emission layer 180, but the present invention is not limited thereto. Alternative exemplary embodiments may employ a low molecular weight material for the emission layer 180. In the case of using the low molecular weight material, the emission layer 180 may be formed by an evaporating method. Display devices using low molecular weight material in an emission layer are also called small molecule OLED, or SMOLED, displays.

As described above, the present invention provides a display device which can apply a common voltage efficiently throughout the display and has an improved contrast ratio.

Further, the present invention provides a fabricating method of a display device that can apply a common voltage efficiently throughout the display and has an improved contrast ratio.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A display device comprising:
a first insulating substrate;
a thin film transistor formed on the first insulating substrate;
a first electrode electrically connected with the thin film transistor;
an emission layer formed on the first electrode;
a second electrode formed on the emission layer;
an auxiliary electrode electrically connected with the second electrode receiving a common voltage; and
a second insulating substrate placed on the auxiliary electrode and
wherein the second electrode receives the common voltage by a first common voltage applying part and the auxiliary electrode receives the common voltage by a second common voltage applying part.

2. The display device according to claim 1, further comprising a black matrix formed between the auxiliary electrode and the second insulating substrate.

3. The display device according to claim 2, wherein the black matrix comprises one of an organic material containing a black pigment, and chrome oxide.

4. The display device according to claim 1, further comprising an organic layer formed on a portion of the first electrode exposed through the auxiliary electrode.

5. The display device according to claim 4, wherein the emission layer comprises a plurality of sub-layers which differ in the color of light emitted therefrom, and the organic layer is transparent.

6. The display device according to claim 5, wherein each of the plurality of sub-layers comprise one of a layer which emits red light therefrom, a layer which emits green light therefrom and a layer which emits blue light therefrom.

7. The display device according to claim 4, wherein the emission layer emits white light, and the organic layer is a color filter comprising a plurality of sub-layers which differ in color.

8. The display device according to claim 7, wherein each of the plurality of sub-layers comprise one of a layer which emits red light therefrom, a layer which emits green light therefrom and a layer which emits blue light therefrom.

9. The display device according to claim 1, wherein the auxiliary electrode comprises at least one selected from a group consisting of aluminum, silver, copper and gold.

10. The display device according to claim 1, wherein the second electrode has a light transmissivity of about 50% or more.

11. The display device according to claim 1, further comprising a conductive layer interposed between the second electrode and the auxiliary electrode.

12. The display device according to claim 11, wherein the conductive layer comprises at least one selected from a group consisting of polypyrrole, polyaniline and polythiophene.

13. The display device according to claim 11, wherein the conductive layer comprises conductive particles.

14. The display device according to claim 13, wherein the conductive particle comprises one of silver and nickel.

15. The display device according to claim 1, wherein light is emitted from the emission layer to an outside through the second insulating substrate.

16. The display device according to claim 15, wherein the first insulating substrate comprises a display region and a non-display region formed along the circumference of the display region, and the non-display region is formed with a non-conductive sealant to join the first and second insulating substrates together.

17. The display device according to claim 2, further comprising a moisture absorption layer interposed between the black matrix and the auxiliary electrode.

18. The display device according to claim 17, wherein the moisture absorption layer comprises at least one selected from a group consisting of calcium(Ca), barium(Ba), calcium oxide(CaO) and barium oxide(BaO).

19. The display device according to claim 1, wherein the first insulating substrate comprises a display region and a non-display region formed along a circumference of the display region, and the non-display region is formed with a shorting bar which applies the common voltage to the auxiliary electrode.

20. The display device according to claim 1, further comprising a partition wall surrounding the emission layer.

21. The display device according to claim 20, wherein the first insulating substrate comprises a display region and a non-display region formed in the circumference of the display region, and the auxiliary electrode and the partition wall face each other in the display region.

22. The display device according to claim 1, wherein the first insulating substrate comprises a display region and a non-display region formed along a circumference of the display region, and the second common voltage applying part is disposed in the non-display region.

23. The display device according to claim 22, further comprising a first contact member and a second contact member formed on a same layer as the pixel electrode, respectively, in the first common voltage applying part and the second common voltage applying part.

24. The display device according to claim 23, wherein the auxiliary electrode is connected to the second common voltage applying part by the second contact member and a shorting bar.

* * * * *